(12) United States Patent
Lin et al.

(10) Patent No.: US 12,543,314 B2
(45) Date of Patent: Feb. 3, 2026

(54) SEMICONDUCTOR DEVICE AND METHOD OF FABRICATING THE SAME

(71) Applicant: Fujian Jinhua Integrated Circuit Co., Ltd., Quanzhou (CN)

(72) Inventors: Yu Chun Lin, Quanzhou (CN); Sun-Hung Chen, Quanzhou (CN); Anqi Liu, Quanzhou (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 471 days.

(21) Appl. No.: 18/109,271

(22) Filed: Feb. 14, 2023

(65) Prior Publication Data
US 2024/0224518 A1 Jul. 4, 2024

(30) Foreign Application Priority Data

Dec. 30, 2022 (CN) .......................... 202211731309.9
Dec. 30, 2022 (CN) .......................... 202223602467.2

(51) Int. Cl.
*H10B 43/27* (2023.01)
*H10B 41/27* (2023.01)
*H10B 41/35* (2023.01)
*H10B 43/35* (2023.01)

(52) U.S. Cl.
CPC ............ *H10B 43/27* (2023.02); *H10B 41/27* (2023.02); *H10B 41/35* (2023.02); *H10B 43/35* (2023.02)

(58) Field of Classification Search
CPC ................................ H10B 41/27; H10B 43/27
See application file for complete search history.

(56) References Cited

U.S. PATENT DOCUMENTS

| | | | |
|---|---|---|---|
| 9,837,420 B1 | 12/2017 | Ramaswamy | |
| 11,444,088 B2 | 9/2022 | Li | |
| 11,456,299 B2 | 9/2022 | Tang | |
| 2021/0375990 A1 | 12/2021 | Young | |
| 2022/0149053 A1* | 5/2022 | Lee | H10B 43/27 |

* cited by examiner

*Primary Examiner* — Christopher A Johnson
(74) *Attorney, Agent, or Firm* — Winston Hsu (57) ABSTRACT

The invention discloses a semiconductor device including a substrate, a stacked structure, a trench, a channel structure, and a barrier layer. The stacked structure is disposed on the substrate, wherein the stacked structure includes a first metal layer, at least one stacked layer and a second metal layer from bottom to top. The trench is disposed in the stacked structure. The channel structure is disposed in the trench, wherein the channel structure fills up the trench. The barrier layer is disposed in the second metal layer, wherein the trench penetrates through the barrier layer. Therefore, the barrier layer can effectively prevent the diffusion of metal ions in the second metal layer from polluting the channel structure in the trench, and the structural reliability and performance of the semiconductor device can be improved.

11 Claims, 9 Drawing Sheets

SEMICONDUCTOR DEVICE AND METHOD OF FABRICATING THE SAME

BACKGROUND OF THE INVENTION

1. Field of the Invention

The present invention relates to a semiconductor device and the method for fabricating the same, in particular to a semiconductor device with a vertical channel structure and a method for fabricating the same.

2. Description of the Prior Art

By improving the process, circuit design, programming algorithm and manufacturing method, a planar semiconductor device may be reduced to a smaller size. However, as the feature size of semiconductor devices approaches the lower limit, the methods for fabricating related devices become extremely challenging and costly. Nowadays, the development of planar semiconductor devices encounters the bottleneck. In order to solve the density limit of the abovementioned planar semiconductor devices, semiconductor devices with three-dimensional structures have become the mainstream development trend. Semiconductor memory devices such as three-dimensional NAND and related manufacturing processes are constantly improved to maintain good device efficiency on the premise of simplified processes.

SUMMARY OF THE INVENTION

The present invention aims to provide a semiconductor device, in which a barrier layer is additionally disposed between a metal layer and a channel structure. In this way, the existence of the barrier layer can effectively prevent the metal ions in the second metal layer from diffusing to the trench and further polluting the channel structure in the trench. Therefore, the structural reliability and performance of the semiconductor device can be improved.

The present invention aims to provide a method for fabricating a semiconductor device, wherein a barrier layer is additionally disposed between a channel structure and a metal layer to prevent the channel structure from directly contacting the metal layer. The existence of the barrier layer can effectively prevent the metal ions in the metal layer from diffusing and polluting the channel structure, such that the obtained semiconductor device can have optimized structural reliability and performance.

The present invention aims to provide a semiconductor device, which includes a substrate, a stacked structure, a trench, a channel structure and a barrier layer. The stacked structure is disposed on the substrate. The stacked structure includes a first metal layer, at least one stacked layer and a second metal layer from bottom to top. The trench is disposed in the stacked structure. The channel structure is disposed in the trench, wherein the channel structure fills up the trench. The barrier layer is disposed in the second metal layer, wherein the trench penetrates through the barrier layer.

The present invention aims to provide a method for fabricating a semiconductor device, which includes the following steps. First, a substrate is provided, a stacked structure is formed on the substrate. The stacked structure includes a first metal layer, at least one stacked layer, and a second metal layer from bottom to top. Then a trench is formed in the stacked structure. Then a channel structure is formed in the trench, wherein the channel structure fills up the trench. Then a barrier layer is formed on the substrate. The barrier layer is formed in the second metal layer, and the trench penetrates through the barrier layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. It should be noted that all the figures are diagrammatic. Relative dimensions and proportions of parts of the drawings have been shown exaggerated or reduced in size, for the sake of clarity and convenience in the drawings. The same reference numerals are generally used to refer to corresponding or similar features in modified and different embodiments. FIG. 1 to FIG. 8 are schematic diagrams illustrating a fabricating method of a semiconductor device according to a first embodiment of the present invention, wherein:

DETAILED DESCRIPTION

To provide a better understanding of the presented disclosure, preferred embodiments will be described in detail. The preferred embodiments of the present disclosure are illustrated in the accompanying drawings. In addition, the technical features in different embodiments described as follows may be replaced, recombined, or mixed with one another to constitute another embodiment without departing from the spirit of the present disclosure.

FIG. 1 to FIG. 8 which illustrate steps of a method for fabricating a semiconductor device 200 in a first embodiment of the present invention. First, referring to FIG. 1, a substrate 100 is provided (e.g. a silicon substrate, a silicon-containing substrate, an epitaxial silicon substrate, a silicon-on-insulator substrate or other substrate made of suitable materials). Those skilled in the art can easily understand that various semiconductor components can be further formed on or in the substrate 100 according to the actual device requirements (e.g. transistors with the same or different conductivity types, such as P-type transistors (PMOS), N-type transistors (NMOS), memory devices or interconnections, etc).

Figure 1:
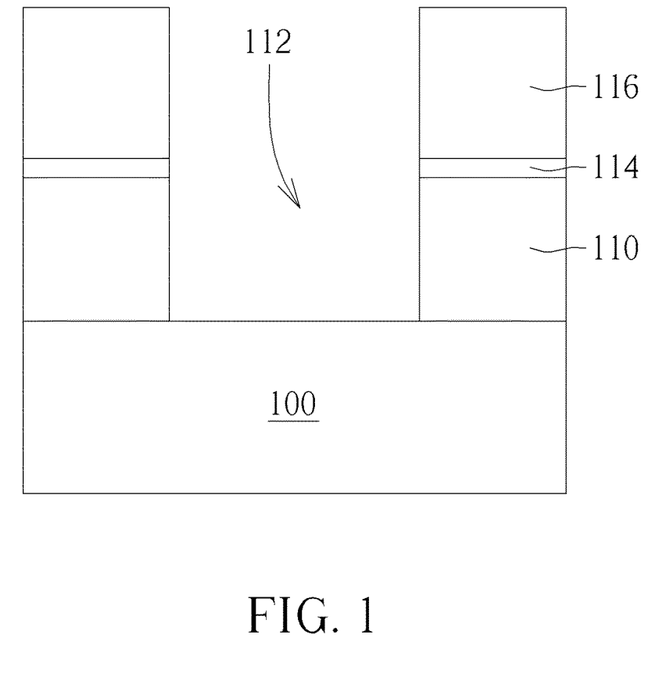
FIG. 1 shows a schematic cross-sectional view of the semiconductor device after a through hole is formed.

Next, a first metal layer 110 is formed on the substrate 100, and a through hole 112 penetrating through the first metal layer 110 is formed in the first metal layer 110 through a mask structure formed on the first metal layer 110. In detail, the mask structure includes a mask layer 114 and a photoresist layer 116 stacked on the first metal layer 110 in sequence. By performing a patterning process through the mask structure, the pattern of the photoresist layer 116 is sequentially transferred to the mask layer 114 and the first metal layer 110 under the photoresist layer 116, such that a through hole 112 is formed in the first metal layer 110, and a portion of the substrate 100 is exposed. In an embodiment, the first metal layer 110 includes metal conductive materials, such as aluminum (Al), titanium (Ti), tantalum (Ta), tungsten (W), niobium (Nb), molybdenum (Mo) and copper (Cu), the mask layer 114 includes dielectric materials, such as silicon nitride, silicon carbonitride and silicon oxynitride, and the photoresist layer 116 includes suitable photoresist materials, but not limited thereto.

Figure 2:
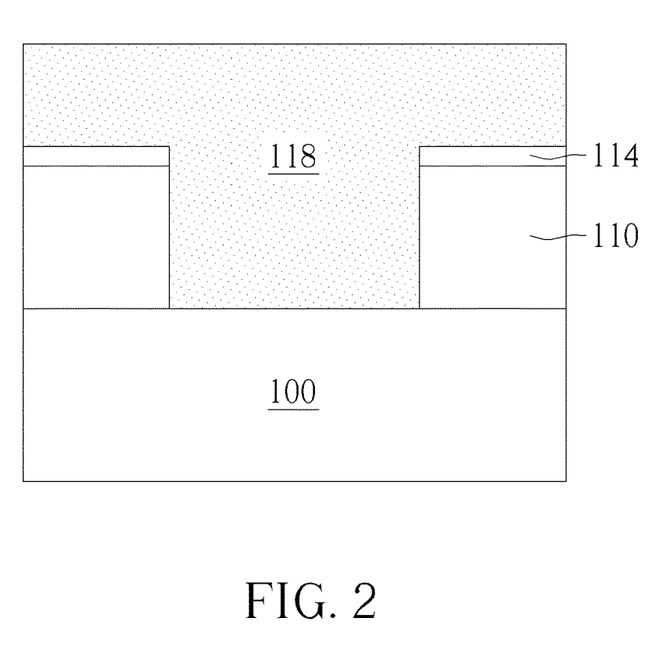
FIG. 2 shows a schematic cross-sectional view of the semiconductor device after a barrier material layer is formed.

As shown in FIG. 2, after the photoresist layer 116 is removed, a barrier material layer 118 is formed on the substrate 100 by a deposition process to thereby fill up the through hole 112 and further cover the mask layer 114. It should be noted that the barrier material layer 118 includes, for example, a conductive material, preferably selected from the group consisting of indium aluminum zinc oxide (InAlZnO), indium tin oxide (ITO), doped indium gallium zinc oxide (IGZO), titanium nitride (TiN), tantalum nitride (TaN), and tungsten nitride (WN). In this embodiment, the barrier material layer 118 may optionally have a single layer structure or a composite layer structure, but not limited thereto.

Figure 3:
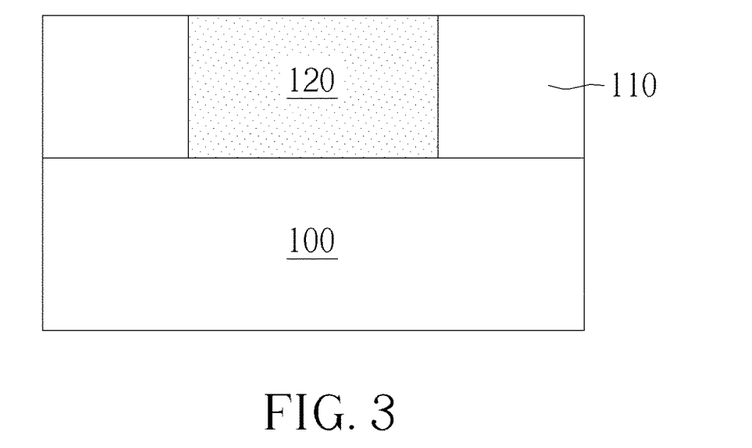
FIG. 3 shows a schematic cross-sectional view of the semiconductor device after a planarization process.

As shown in FIG. 3, a planarization process is performed to remove the barrier material layer 118 covering the mask layer 114, and to further remove the mask layer 114, and a barrier material layer 120 is thereby formed in the first metal layer 110, with a top surface of the first barrier material layer 120 being coplanar with a top surface of the first metal layer 110.

Figure 4:
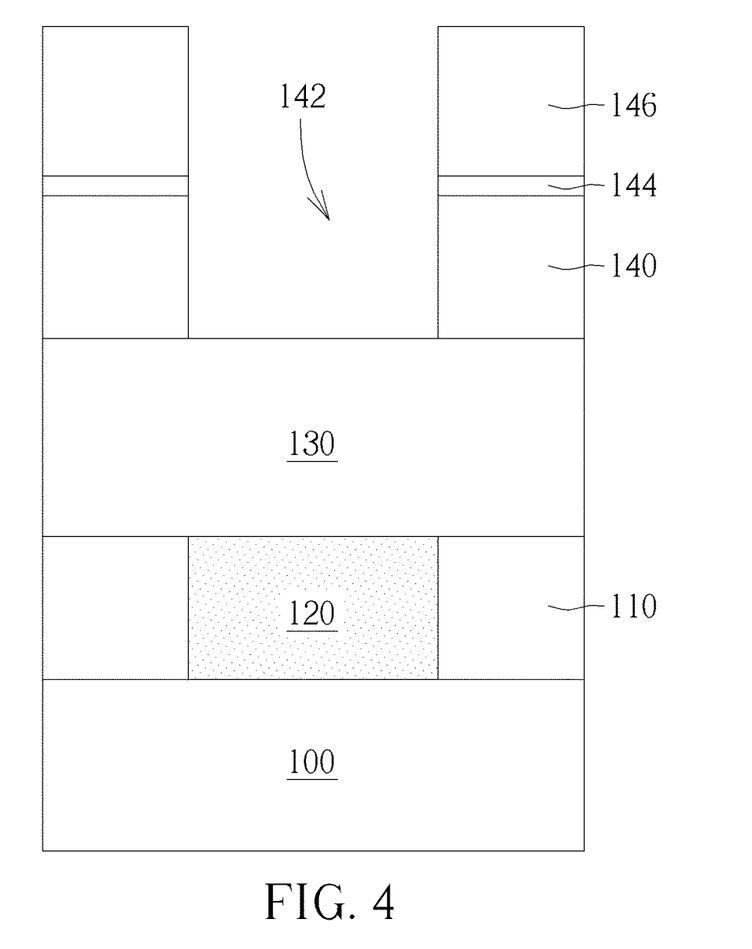
FIG. 4 shows a schematic cross-sectional view of the semiconductor device after another through hole is formed.

Then, as shown in FIG. 4, at least one stacked layer 130, a second metal layer 140 and a further mask structure are sequentially formed on the barrier material layer 120 and the first metal layer 110, and a through hole 142 penetrating through the second metal layer 140 is formed in the second metal layer 140 through the further mask structure. In detail, the further mask structure includes a mask layer 144 and a photoresist layer 146 stacked on the second metal layer 140 in sequence. By performing a patterning process through the further mask structure, the pattern of the photoresist layer 146 is sequentially transferred to the mask layer 144 and the second metal layer 140 below to form the through hole 142 in the second metal layer 140, which exposes a portion of the stacked layer 130. The position where the through hole 142 is formed is, for example, aligned with the position of the underlying barrier material layer 120 as shown in FIG. 4.

It is noted that the stacked layer 130 may include any suitable material and thickness. In this embodiment, although the stacked layer 130 including a single film layer is taken as an embodiment, the stacked layer 130 may also include multiple stacked layers according to actual device requirements, which is not limited to that shown in FIG. 4. In addition, the second metal layer 140 includes, for example, metal conductive materials, such as aluminum, titanium, tantalum, tungsten, niobium, molybdenum, copper, etc., the mask layer 144 includes, for example, dielectric materials, such as silicon nitride, silicon carbonitride, silicon oxynitride, etc., and the photoresist layer 146 includes, for example, suitable photoresist materials, but not limited thereto.

Figure 5:
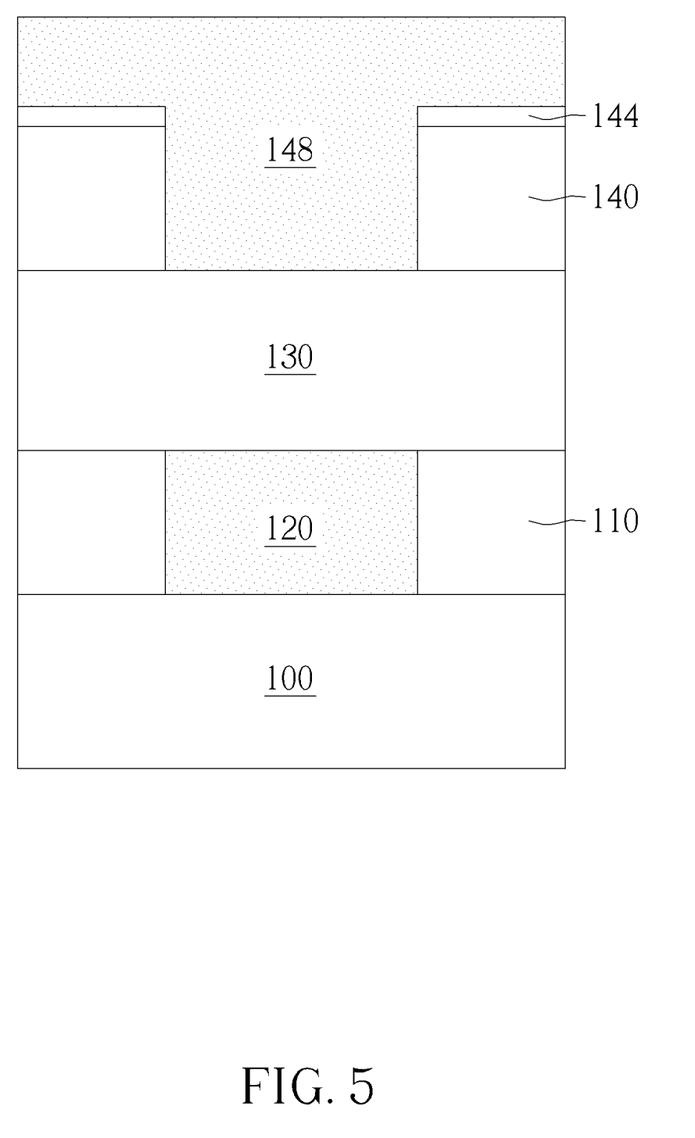
FIG. 5 shows a schematic cross-sectional view of the semiconductor device after another barrier material layer is formed.

As shown in FIG. 5, after the photoresist layer 146 is removed, a barrier material layer 148 is formed on the substrate 100 by a deposition process to thereby fill up the through hole 142 and further cover the mask layer 144. It is noted that the barrier material layer 148 also includes a conductive material, preferably selected from the group consisting of indium aluminum zinc oxide, indium tin oxide, doped indium gallium zinc oxide, titanium nitride, tantalum nitride, and tungsten nitride. In an embodiment, the barrier material layer 148 and the barrier material layer 120 may include the same conductive material, but not limited thereto. In addition, the barrier material layer 148 may optionally have a single layer structure or a composite layer structure, but not limited thereto.

Figure 6:
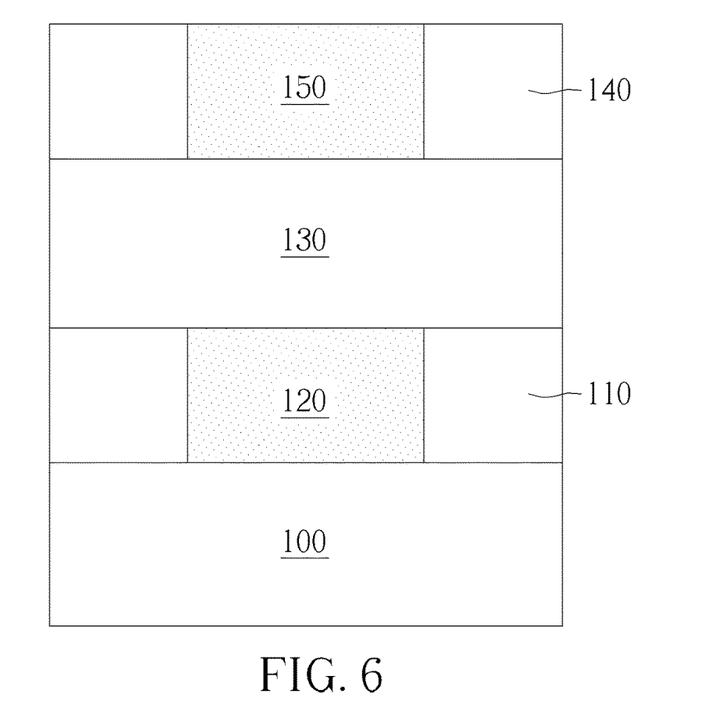
FIG. 6 shows a schematic cross-sectional view of the semiconductor device after another planarization process.

As shown in FIG. 6, a further planarization process is performed to remove the barrier material layer 148 covering the mask layer 144, and to further remove the mask layer 144, and a barrier material layer 150 is thereby formed in the second metal layer 140, with a top surface of the barrier material layer 150 being coplanar with a top surface of the second metal layer 140.

Figure 7:
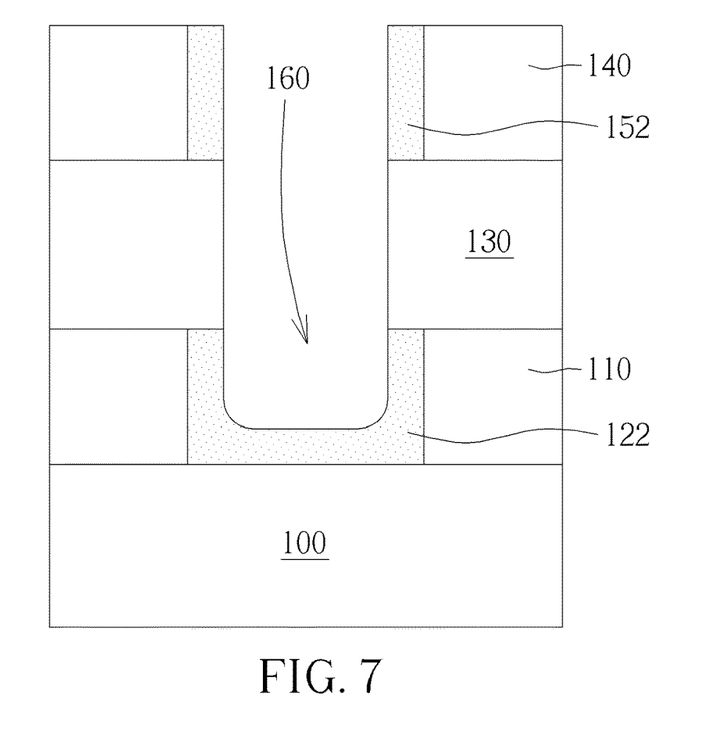
FIG. 7 shows a schematic cross-sectional view of the semiconductor device after a trench is formed.

As shown in FIG. 7, a trench 160 is formed on the substrate 100 that sequentially penetrates through the second metal layer 140, the stacked layer 130, and a portion of the first metal layer 110. It is noted that, when the trench 160 is formed, the barrier material layer 150 (as shown in FIG. 6) located in the second metal layer 140 and a portion of the barrier material layer 120 (as shown in FIG. 6) located in the first metal layer 110 are passed through by the trench 160, such that the barrier layer 152 and a further barrier layer 122 can be formed simultaneously. It is noted that the barrier layer 152 and the further barrier layer 122 are located at the top and bottom of the trench 160, respectively, and directly contact the top surface and bottom surface of the stacked layer 130. Even though the schematic cross-sectional view shown in FIG. 7 illustrates that the barrier layer 152 is located on the two opposite sidewalls of the top of the trench 160 and the further barrier layer 122 is located on the two opposite sidewalls and on the bottom of the trench 160, those skilled in the art can easily understand that, from a top view (not shown in the drawings), the barrier layer 152 surrounds the sidewall of the trench 160, and the further barrier layer 122 integrally wraps around the bottom of the trench 160, but it is not limited thereto.

Figure 8:
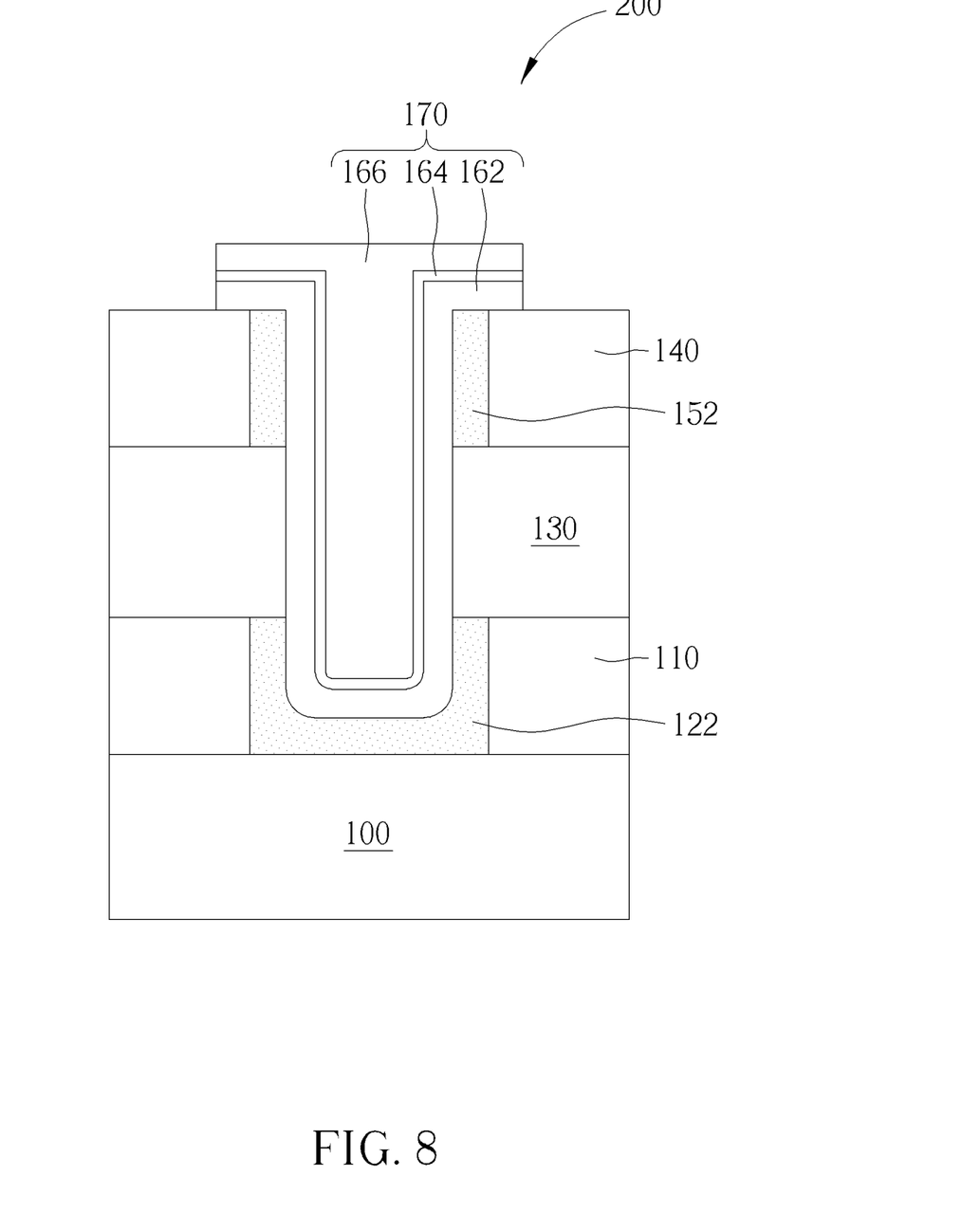
FIG. 8 shows a schematic cross-sectional view of the semiconductor device after a channel structure is formed.

Then, as shown in FIG. 8, a channel structure 170 is formed to fill up the trench 160. The channel structure 170 includes a functional layer formed on the inner sidewall of the trench 160 and a filling layer filling up the remaining space of the trench 160. In this embodiment, the functional layer includes a channel layer 162 and an insulating layer 164 stacked in sequence on the inner sidewall of the trench 160, and the filling layer includes a conductive layer 166. The channel layer 162 includes, for example, indium aluminum zinc oxide, indium tin oxide or other suitable conductive materials. The insulating layer 164 includes a dielectric material with high dielectric constant such as hafnium oxide ($HfO_2$), hafnium silicon oxide ($HfSiO_4$), hafnium silicon oxynitride (HfSiON), zinc oxide ($ZrO_2$) or titanium oxide ($TiO_2$). The conductive layer 166 includes a metal material with low resistance, such as aluminum, titanium, copper or tungsten, but not limited thereto.

Under this arrangement, the channel structure 170 may form a vertically arranged gate structure, which sequentially passes through the second metal layer 140, the stacked layer 130 and a portion of the first metal layer 110, and the channel structure 170, the first metal layer 110 and the second metal layer 140 together form a transistor. In this way, the conductive layer 166 may be used as a gate, and the vertical-columnar insulating layer 164 and the channel layer 162 sequentially surround the outer sidewall of the conductive layer 166, which serve as a gate dielectric layer and a gate channel of the gate, respectively, such that the gate can contain a function similar to that of gate-all-around (GAA). In addition, the second metal layer 140 passed through by the channel structure 170 and the first metal layer 110 partially passed by the channel structure 170 may be used as the source/drain (S/D) of the gate, respectively. The barrier layer 152 is sandwiched between the second metal layer 140 and the channel structure 170, and the further barrier layer 122 is sandwiched between the first metal layer 110 and the channel structure 170. Accordingly, the metal ions of the second metal layer 140 and/or the first metal layer 110 can be blocked from diffusing into the channel layer 162 by the further barrier layer 122 and the second metal layer 140, and thus avoiding polluting the channel layer 162 of the channel structure 170.

Thus, the semiconductor device 200 of this embodiment is completed. According to the fabricating method of this embodiment, the further barrier layer 122 and the barrier layer 152 are additionally disposed between the first metal layer 110, the second metal layer 140 and the channel structure 170, such that the channel layer 162 in the channel structure 170 does not directly contact the first metal layer 110 or the second metal layer 140, and metal ions from the second metal layer 140 and/or the first metal layer 110 can be blocked from diffusing into and contaminating the channel layer 162. The problem that the threshold voltage of the transistor decreases derived from the diffusion of the metal ion is solved. It is noted that the material of the further barrier layer 122 and/or the barrier layer 152 is selected from the group consisting of indium aluminum zinc oxide, indium tin oxide, doped indium gallium zinc oxide, titanium nitride, tantalum nitride, and tungsten nitride, which serves as a contact layer between the gate and the gate dielectric layer or an RC reduce layer for reducing resistance-capacitance delay. The barrier layer 152 is sandwiched between the second metal layer 140 and the channel structure 170, and the further barrier layer 122 is sandwiched between the first metal layer 110 and the channel structure 170. The first metal layer 110 may further surround the bottom of the channel structure 170. In this way, the semiconductor device 200 of this embodiment can have optimized structural reliability and achieve great device performance.

In addition, those skilled in the art would easily understand that, in order to meet the actual product requirements, the semiconductor device and the fabricating method thereof may have other embodiments, but not limited to the foregoing. Other embodiments or variations of the fabricating method of the semiconductor device in the present invention are further described below. In order to simplify the explanation, the following description mainly focuses on the differences of each embodiment, and the same parts are not repeated. In addition, the same components in each embodiment of the present invention are labeled with the same reference numerals, so as to facilitate the cross-reference among the embodiments.

Figure 9:
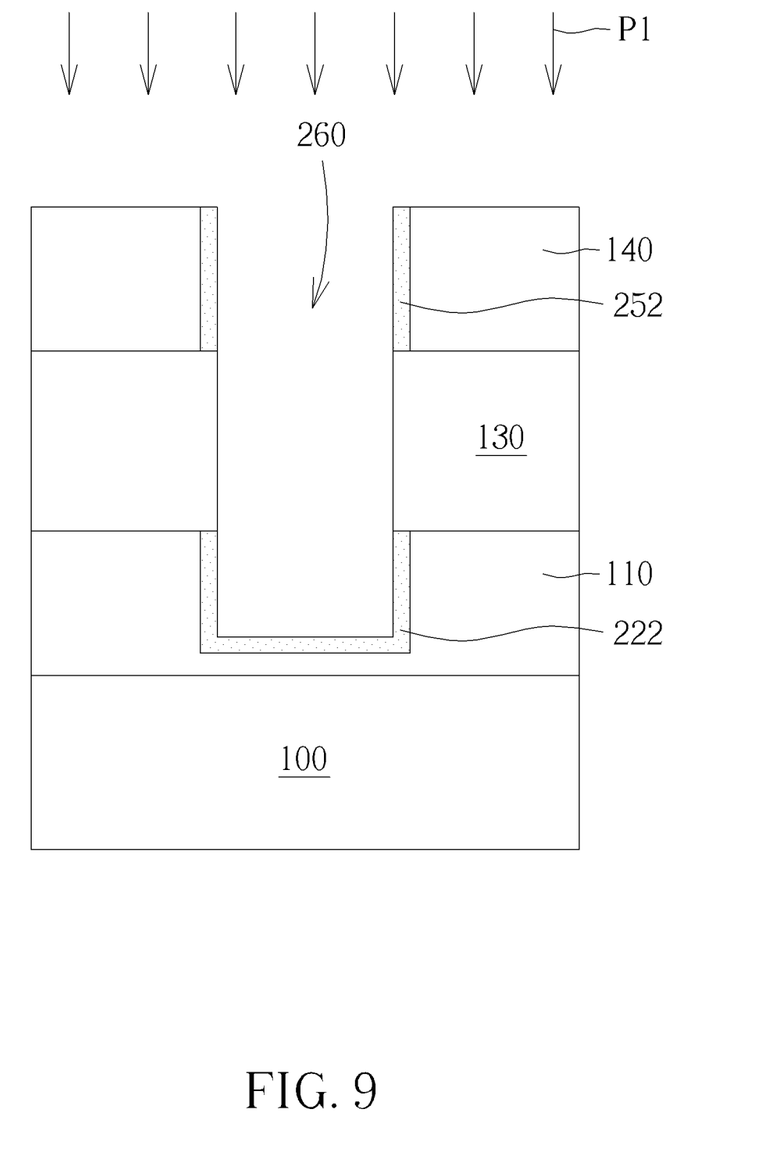
FIG. 9 shows a schematic diagram illustrating a fabricating method of a semiconductor device according to the second embodiment of the present invention.

Referring to FIG. 9, which shows the step of the fabricating method of the semiconductor device in a second embodiment of the present invention. The overall structure of the semiconductor device in this embodiment is basically the same as the overall structure of the semiconductor device 200 in the first embodiment, and the same parts are not repeated here. The main difference between this embodiment and the first embodiment is that a barrier layer 252 and a further barrier layer 222 are directly formed by a surface treatment process P1 without depositing a barrier material layer.

In detail, in this embodiment, the steps shown in FIG. 1 to FIG. 5 in the previous embodiment are omitted. The first metal layer 110, the stacked layer 130 and the second metal layer 140 are directly formed on the substrate 100, which are stacked in sequence. The trench 260 is formed, which penetrates through the second metal layer 140 and the stacked layer 130 and partially penetrates through the first metal layer 110. The surfaces of the second metal layer 140, the stacked layer 130 and the first metal layer 110 are partially exposed from the trench 260 as shown in FIG. 9. Then, the surface treatment process P1, such as a nitridation process, is performed to nitridize the exposed surfaces of the second metal layer 140 and the first metal layer 110 to respectively form the barrier layer 252 and the further barrier layer 222, which are located at the top and bottom of the trench 260, respectively. The barrier layer 252 and the further barrier layer 222 may directly contact the top surface and the bottom surface of the stacked layer 130. It is noted that the barrier layer 252 and the further barrier layer 222 include nitridized materials generated from the second metal layer 140 and the first metal layer 110, respectively. For example, if the second metal layer 140 and the first metal layer 110 include a metal material, such as titanium, tantalum, or tungsten, the barrier layer 252 and the further barrier layer 222 include a material, such as titanium nitride, tantalum nitride, or tungsten nitride, but not limited thereto.

In this way, in the subsequent fabricating process, the channel structure as shown in FIG. 7 in the previous embodiment may be formed in the trench 260, such that the barrier layer 252 and the further barrier layer 222 may be sandwiched between the first metal layer 110 or the second metal layer 140 and the channel structure, respectively, so as to prevent the diffusion of metal ions from the second metal layer 140 and/or the first metal layer 110 and the contamination of the channel structure. Therefore, the semiconductor device obtained according to the fabricating method of this embodiment may also have optimized structural reliability and achieve good device performance.

Figure 10:
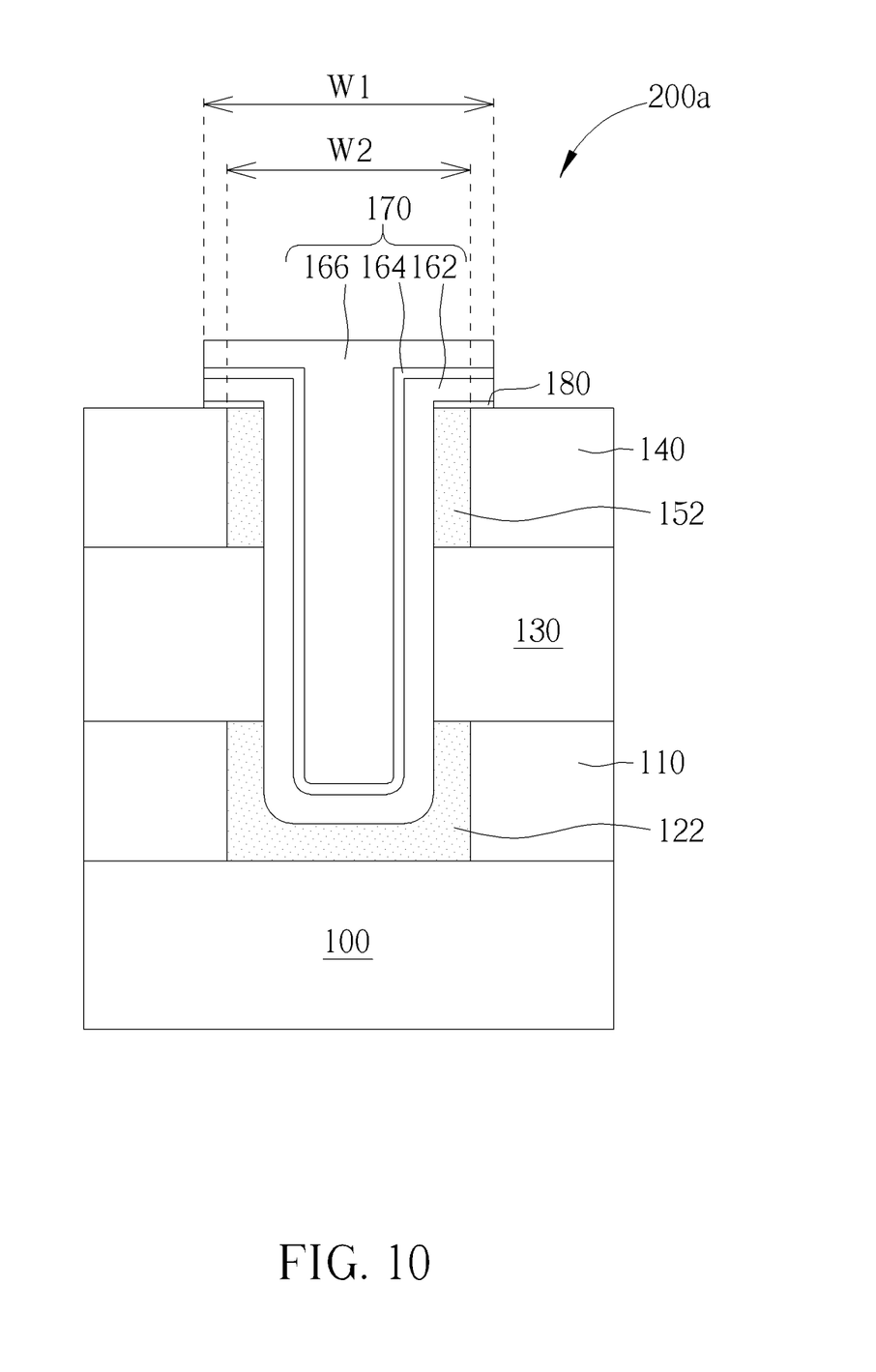
FIG. 10 shows a schematic diagram illustrating a fabricating method of a semiconductor device according to the third embodiment of the present invention.

Referring to FIG. 10, which shows the step of the fabricating method of the semiconductor device in a third embodiment of the present invention. The overall structure of the semiconductor device 200a in this embodiment is basically the same as the overall structure of the semiconductor device 200 in the aforementioned first embodiment, and the same parts are not repeated here. The main difference between this embodiment and the first embodiment is that an isolation layer 180 is additionally provided between the barrier layer 152 and the channel structure 170.

In detail, in this embodiment, after the barrier material layer 150 as shown in FIG. 6 is formed in the second metal layer 140, an isolation material layer (not shown) is additionally formed on the second metal layer 140 and the barrier material layer 150. For example, the isolation material layer includes a conductive material selected from the group consisting of indium aluminum zinc oxide, indium tin oxide, doped indium gallium zinc oxide, titanium nitride, tantalum nitride, and tungsten nitride. Preferably the isolation material layer and the barrier material layer 150 include the same conductive material.

In this way, when the trench 160 as shown in FIG. 7 is subsequently formed, the isolation material layer is partially removed to form the isolation layer 180, which is sandwiched between the subsequently formed channel structure 170 and the barrier layer 152. Therefore, the isolation layer 180 can further prevent metal ions of the second metal layer 140 from diffusing and contaminating the channel structure 170, and the maximum width W1 of the channel structure 170 in the horizontal direction may be greater than the maximum width W2 of the barrier layer 152 in the horizontal direction, such that the top of the channel structure 170 may partially overlap the second metal layer 140 in the vertical direction. It is noted that, in the embodiment that the isolation layer 180 and the barrier layer 152 include the same conductive material, the isolation layer 180 may be regarded as an extension portion of the barrier layer 152, such that the maximum width W1 of the barrier layer (including the barrier layer 152 and the isolation layer 180 as shown in FIG. 10) as a whole is greater than the maximum width W2 of the further barrier layer 122. Therefore, the semiconductor device 200a obtained according to the fabricating method of this embodiment may have optimized structural reliability and achieve good device performance.

Figure 11:
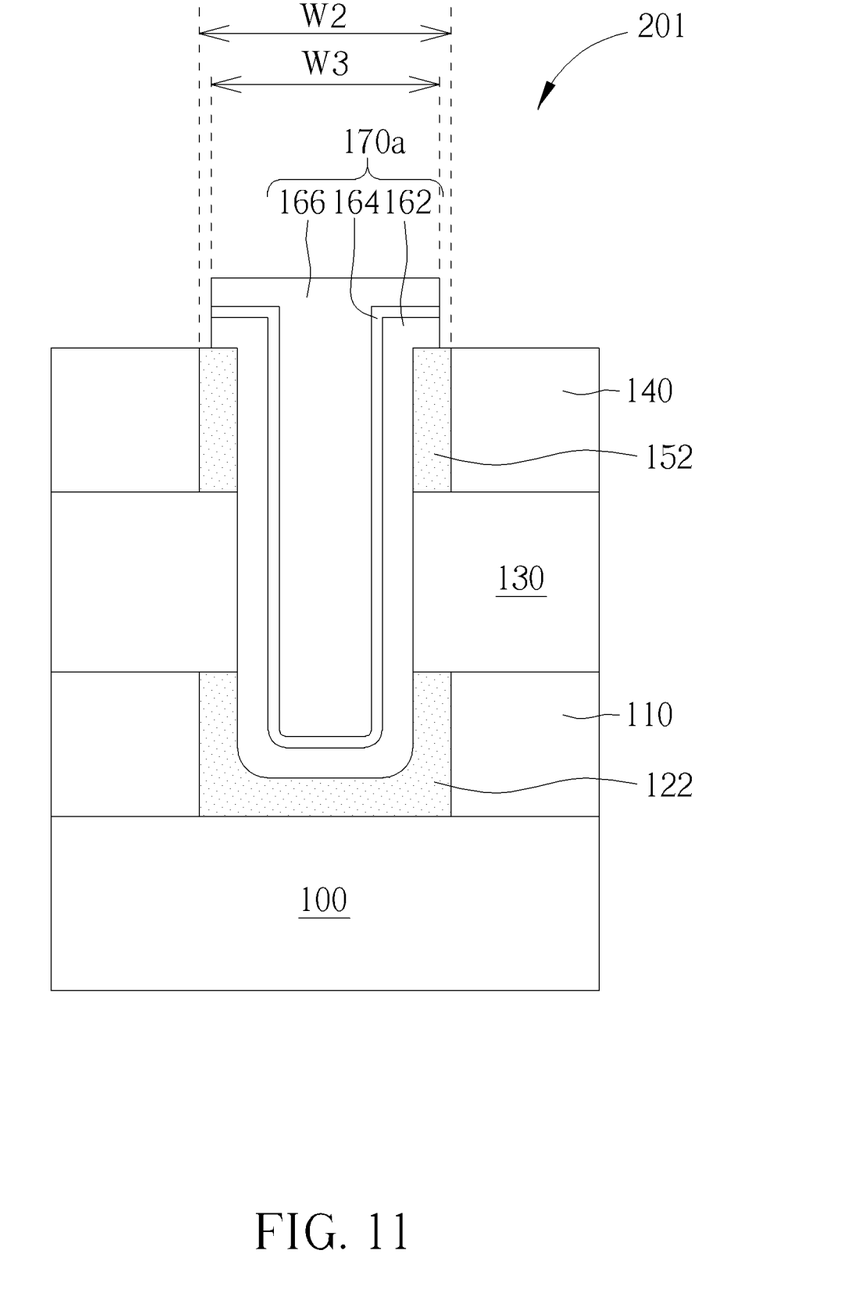
FIG. 11 shows a schematic diagram illustrating a fabricating method of a semiconductor device according to the fourth embodiment of the present invention.

Referring to FIG. 11, which shows the step of the fabricating method of the semiconductor device in a fourth embodiment of the present invention. The overall structure of the semiconductor device 201 in this embodiment is basically the same as the overall structure of the semiconductor device 200 in the aforementioned first embodiment, and the same parts are not repeated here. The main difference between this embodiment and the first embodiment is that the vertical sidewall of the top of the channel structure 170a falls within the region of the barrier layer 152.

In detail, in this embodiment, when the channel structure 170a is formed, the top of the channel structure 170a is deliberately not contacted with the second metal layer 140, such that the maximum width W3 of the channel structure 170a in the horizontal direction is less than the maximum width W2 of the barrier layer 152 in the horizontal direction, which can further prevent metal ions of the second metal layer 140 from diffusing and contaminating the channel structure 170a. Therefore, the semiconductor device 201 obtained according to the fabricating method of this embodiment may also have optimized structural reliability and achieve good device performance.

Overall, in the invention, the barrier layers are additionally disposed between the channel layer and the metal layer including a metal material by using a deposition process or a surface treatment process, and the barrier layers prevents the channel layer from directly contacting the metal layer, thereby blocking the metal ions from diffusing from the metal layer into the channel layer, and effectively prevent the channel layer from being polluted by the metal ions. The problem that the threshold voltage of the transistor decreases derived from the diffusion of the metal ion is solved. In addition, the material of the barrier layer may be selected from the group consisting of indium aluminum zinc oxide, indium tin oxide, doped indium gallium zinc oxide, titanium nitride, tantalum nitride and tungsten nitride. The barrier layer may be further used as a contact layer between the gate and the gate dielectric layer or an RC reduce layer for reducing resistance-capacitance delay, such that the semiconductor device of the present invention has optimized structural reliability and achieve good device performance.

Figure 12:
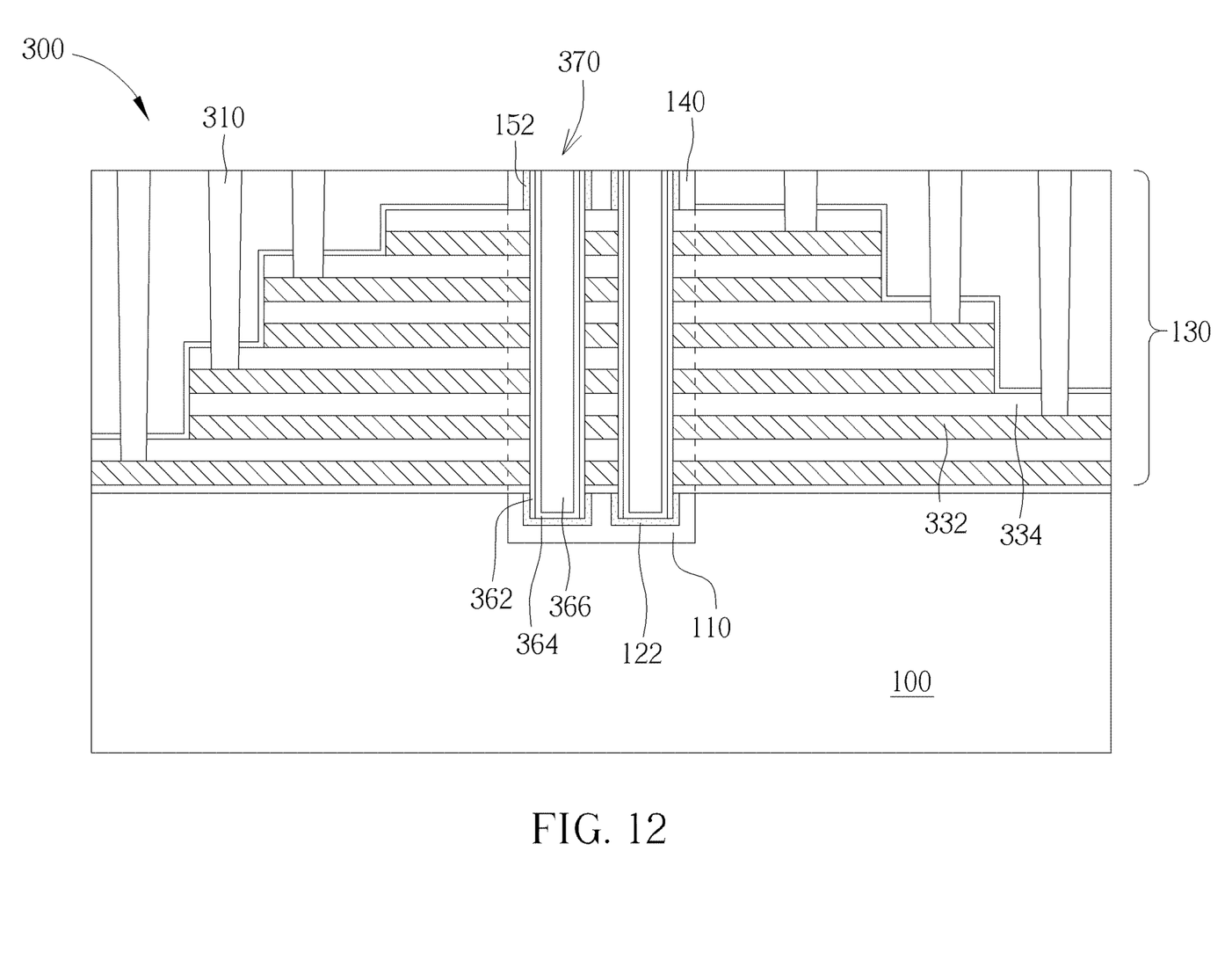
FIG. 12 shows a schematic diagram of a semiconductor device according to a preferred embodiment of the present invention.

Therefore, the fabricating method and/or the semiconductor device of the present invention may be applied to the formation of semiconductor structures with vertical columnar channel layers, such as conductive pillars, plugs, etc., so as to improve the structural reliability and performance of the channel layers. Referring to FIG. 12, which is a schematic cross-sectional view of a semiconductor device in a preferred embodiment of the present invention. In this embodiment, the semiconductor device is, for example, a three dimensional NAND memory device 300 including a substrate 100, at least one stacked layer 130 disposed on the substrate 100, and multiple channel structures 370 penetrating through the stacked layer 130.

In detail, the stacked layer 130 of the present embodiment includes multiple conductive layers 332 and multiple dielectric layers 334 alternately stacked. The dielectric layers 334 include the same dielectric material, such as silicon oxide, silicon nitride, silicon oxynitride or a combination thereof, and the conductive layers 332 include the same conductive material, such as aluminum, titanium, tantalum, tungsten, niobium, molybdenum and copper, but not limited thereto. It is noted that any conductive layer 332 and the corresponding overlying dielectric layer 334 together constitute a set of conductive-dielectric layer pair, and the conductive-dielectric layer pairs are stacked into a staircase structure as shown in FIG. 12, which serves as a memory stack structure. In this way, the three dimensional NAND memory device 300 may be electrically connected with the word line contact plug 310 through two sides of the staircase structure to fan out the word lines (i.e., the conductive layers 332).

In this embodiment, the channel structure 370 also includes a functional layer and a filling layer filling up the remaining space of the trench, which are sequentially formed on the inner sidewall of the trench (not shown). The functional layer includes an insulating layer 362 and a channel layer 364 stacked on the inner sidewall of the trench in sequence. The insulating layer 362 includes, for example, a dielectric material such as a composite layer structure of oxide layer-nitride layer-oxide layer (ONO, not shown), and the channel layer 364 includes, for example, a semiconductor material such as silicon or polysilicon, but not limited thereto. In addition, the filling layer includes an insulating layer 366, such as including silicon oxide or other dielectric material, but not limited thereto.

Under this arrangement, the channel structure 370, the stacked layer 130, the first metal layer 110 and the second metal layer 140 (used as source/drain, respectively) may together form transistors, and the intersection of each channel structure 370 and each conductive layer 332 may be used as a memory cell, and each conductive layer 332 may be used as a word line to control the data writing and reading of each memory cell. It is noted that the barrier layer 152 is additionally disposed between the channel structure 370 and second metal layer 140, and the further barrier layer 122 are additionally disposed between the channel structure 370 and the first metal layer 110, which prevents the channel structure 370 from directly contacting the first metal layer 110 or the second metal layer 140, and blocks the metal ions from diffusing from the second metal layer 140 and/or the first metal layer 110 into the channel layer 364 and thus prevents the contamination of the channel layer 364. Therefore, the three dimensional NAND memory device 300 of this embodiment can have a more reliable channel structure 370 and performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
    a substrate;
    a stacked structure disposed on the substrate, wherein the stacked structure comprises a first metal layer, at least one stacked layer and a second metal layer from bottom to top;
    a trench disposed in the stacked structure;
    a channel structure disposed in the trench, wherein the channel structure fills up the trench;
    a barrier layer disposed in the second metal layer, wherein the trench penetrates through the barrier layer; and
    a further barrier layer disposed in the first metal layer, wherein the trench partially penetrates the further barrier layer, and the further barrier layer directly contacts a bottom surface of the channel structure.

2. The semiconductor device according to claim 1, wherein a maximum width of the barrier layer is greater than a maximum width of the channel structure in a horizontal direction.

3. The semiconductor device according to claim 1, wherein the channel structure partially covers a top surface of the stack structure.

4. The semiconductor device according to claim 1, further comprising:
    an isolation layer disposed between the barrier layer and the channel structure.

5. The semiconductor device according to claim 4, wherein the barrier layer and the isolation layer comprise the same material.

6. The semiconductor device according to claim 1, wherein the barrier layer and the further barrier layer directly contact the at least one stacked layer and have different maximum widths in the horizontal direction.

7. The semiconductor device according to claim 1, wherein materials of the barrier layer and the further barrier layer are selected from the group consisting of indium aluminum zinc oxide, indium tin oxide, doped indium gallium zinc oxide, titanium nitride, tantalum nitride, and tungsten nitride.

8. The semiconductor device according to claim 1, wherein the channel structure comprises a channel layer, an insulating layer, and a filling layer stacked sequentially in the trench, wherein the channel layer comprises indium gallium zinc oxide or indium tin oxide, and the insulating layer comprises a dielectric material with high dielectric constant.

9. The semiconductor device according to claim 1, wherein the channel structure comprises an insulating layer, a channel layer and a filling layer stacked sequentially in the trench, wherein the channel layer comprises silicon or polysilicon, and the insulating layer comprises an oxide layer-nitride layer-oxide layer.

10. A semiconductor device, comprising:
    a substrate;
    a stacked structure disposed on the substrate, wherein the stacked structure comprises a first metal layer, at least one stacked layer and a second metal layer from bottom to top;
    a trench disposed in the stacked structure;
    a channel structure disposed in the trench, wherein the channel structure fills up the trench; and
    a barrier layer disposed in the second metal layer, wherein the trench penetrates through the barrier layer, and the barrier layer comprises a material selected from the group consisting of indium aluminum zinc oxide, indium tin oxide, doped indium gallium zinc oxide, titanium nitride, tantalum nitride, and tungsten nitride.

11. A semiconductor device, comprising:
    a substrate;
    a stacked structure disposed on the substrate, wherein the stacked structure comprises a first metal layer, at least one stacked layer and a second metal layer from bottom to top;
    a trench disposed in the stacked structure;
    a channel structure disposed in the trench, wherein the channel structure fills up the trench;
    a barrier layer disposed in the second metal layer, wherein the trench penetrates through the barrier layer; and
    a further barrier layer disposed in the first metal layer, wherein the trench partially penetrates the further barrier layer, wherein the barrier layer and the further barrier layer directly contact the at least one stacked layer and have different maximum widths in the horizontal direction.

* * * * *